United States Patent [19]
Aoki

[11] Patent Number: 6,041,799
[45] Date of Patent: Mar. 28, 2000

[54] MICROWAVE-EXCITATION CLEANING AND RINSING APPARATUS

[75] Inventor: Hidemitu Aoki, Tokyo, Japan

[73] Assignee: NEC Corporation, Japan

[21] Appl. No.: 08/966,052

[22] Filed: Nov. 7, 1997

[30] Foreign Application Priority Data

Nov. 8, 1996 [JP] Japan .................................. 8-296319

[51] Int. Cl.[7] .................................................. B08B 3/00
[52] U.S. Cl. ................... 134/184; 134/902; 134/1
[58] Field of Search .................... 134/184, 902, 134/1, 2, 22.1, 35

[56] References Cited

U.S. PATENT DOCUMENTS

| | | | |
|---|---|---|---|
| 4,121,078 | 10/1978 | Takano et al. | 219/10.55 F |
| 4,629,849 | 12/1986 | Mizutani et al. | 219/10.55 F |
| 5,049,816 | 9/1991 | Moslehi | 324/158 D |
| 5,068,030 | 11/1991 | Chen | 210/95 |
| 5,071,776 | 12/1991 | Matsushita et al. | 437/10 |
| 5,490,882 | 2/1996 | Sachs et al. | 134/1 |
| 5,578,193 | 11/1996 | Aoki et al. | 205/746 |
| 5,579,792 | 12/1996 | Stanasolovich et al. | 134/184 |

FOREIGN PATENT DOCUMENTS

| | | | |
|---|---|---|---|
| 63-73626 | 4/1988 | Japan | H01L 21/304 |
| 1-316935 | 12/1989 | Japan | H01L 21/304 |
| 404357836 | 12/1992 | Japan | 134/902 |
| 5-7869 | 1/1993 | Japan | C02F 1/30 |
| 7-108234 | 4/1995 | Japan | B08B 3/10 |

Primary Examiner—Frankie L. Stinson
Assistant Examiner—Paul J. Lee
Attorney, Agent, or Firm—Hayes, Soloway, Hennessey, Grossman, Hage, P.C.

[57] ABSTRACT

A microwave-excitation cleaning and rinsing apparatus includes a cell having an inlet for supplying pure water or cleaning chemical solution to the cell and an outlet for exhausting the pure water or cleaning chemical solution from the cell, and a microwave oscillator for generating microwaves and irradiating the pure water or cleaning chemical solution within the cell with the microwaves.

12 Claims, 5 Drawing Sheets

MICROWAVE-EXCITATION CLEANING AND RINSING APPARATUS

BACKGROUND OF THE INVENTION

1. Field of the Invention

The present invention relates to a cleaning and rinsing apparatus used in the manufacture of semiconductor devices (wafers).

2. Description of the Related Art

In the manufacture of wafers, particularly, highly-integrated semiconductor devices, a cleaning and rinsing operation is so essential that the manufacturing yield is dependent thereupon. For example, in a cleaning and rinsing operation, contamination, organic or inorganic particles, residual resist and ionic residue are removed from the surface of wafers without affecting the wafers.

In a first prior art cleaning and rinsing method, wafers are immersed in hot chemicals at a temperature of about 50° C. to 90° C. while ultrasonic waves are applied thereto. For example, an alkali solution such as an anmonia water/hydrogen peroxide water mixture (APM) is used to remove nonorganic particles, and an acid solution such as a hydrosulfurous acid/hydrogen peroxide water mixture (SPM) or hydrochloric acid/hydrogen peroxide water mixture (HPM) is used to remove organic particles and metal particles. Also, an alcohol solution such as an isopropyl alcohol solution (IPA) is used to remove organic particles. After a cleaning operation using such chemicals is completed, a rinsing operation using pure water is carried out. In this case, since such chemicals have a high viscosity, the rinsing operation is carried out at a relatively high temperature such as 90° C. Particularly, since SPM includes 80 percent or more hydrosulfurous acid, the viscosity of SPM is very high.

In the first prior art cleaning and rinsing method, although contamination can be removed by chemicals, such chemicals, particularly, SPM cannot be flooded into fine-holes such as contact holes of the wafers, since such chemicals have high viscosity. As a result, it is impossible to completely remove contamination from the wafers.

Also, in the first prior art cleaning and rinsing method, even if use is made of hot pure water heated by a heater, groups of molecules of chemicals and pure water cannot be sufficiently separated. In addition, since the surface tension of the chemicals and the surface tension of pure water are both high, the wettabilities thereof on the wafers are low. As a result, such chemicals and pure water cannot be sufficiently flooded into highly-integrated holes of the wafers, and therefore, it is impossible to completely remove residual ions from the wafers.

In a second prior art cleaning and rinsing method, pure water is subjected to microwaves while the pure water comes into contact with a catalyst made of Pb or Pt particles. In this case, since the pure water is excited by the microwaves, groups of molecules of the pure water are separated into clusters, thus improving the wettability of the pure water. Then, wettability-improved pure water is moved to a use point where the contamination of wafers is removed by the pure water (see: JP-A-5-7869).

In the second prior art cleaning and rinsing method, however, the excited state of pure water cannot continue for a long time. For example, a duration time of the excited state is on the order of ms. Therefore, the pure water which has reached the use point loses activitity, and accordingly, the wafers may not be cleaned or rinsed.

Also, in the second prior art cleaning and rinsing method, since it is impossible to completely remove Pb or Pt particles as the catalyst by using state-of-the-art filtering technology, such particles may be adhered to the wafers, thus deteriorating the characteristics of the wafers.

Further, in the second prior art cleaning and rinsing method, although residual ions and a small amount of organic particles can be removed by the excited pure water, it is impossible to completely remove metal, nonorganic particles or particle contamination from the wafers due to the pure water's pH neutrality.

SUMMARY OF THE INVENTION

It is an object of the present invention to provide an improved microwave-excitation cleaning and rinsing apparatus and method.

According to the present invention, a microwave-excitation cleaning and rinsing apparatus includes a cell having an inlet for supplying pure water or cleaning chemical solution to the cell and an outlet for exhausting the pure water or cleaning chemical solution from the cell, and a microwave oscillator for generating microwaves and irradiating the pure water or cleaning chemical solution within the cell with the microwaves.

Also, according to the present invention, in a method for cleaning and rinsing objects in a cell, pure water or cleaning chemical solution is supplied to the cell, and the objects are immersed in the pure water or cleaning chemical solution. The pure water or cleaning chemical solution is irradiated with microwaves while the objects are immersed In the pure water or cleaning chemical solution.

Thus, the pure water or cleaning chemical solution is activated by the microwaves, and simultaneously, the objects (wafers) are rinsed or cleaned by the activated pure water or cleaning chemical solution.

When pure water or cleaning chemical solution is irradiated with microwaves, groups of molecules of the pure water or cleaning chemical solution are separated into clusters. That is, since the molecules of pure water or cleaning chemical solution constitute permanent dipoles, the permanent dipoles are irradiated with microwaves, the molecules are rotated in accordance with an alternating electric field by the microwaves, so that the molecules are heated. Thus, the groups of molecules of pure water or cleaning chemical solution are separated from each other, i.e., the pure water or cleaning chemical solution is activated.

In the present invention, wafers are cleaned or rinsed while pure water or cleaning chemical solution is being activated. That is, before the activated pure water or cleaning chemical solution is deactivated, the activated pure water or cleaning chemical solution is adhered to the wafers. As a result, the surface tension of the pure water or cleaning chemical solution on the wafers is reduced to enhance the wettability thereof on the wafers. In addition, the activated pure water or cleaning chemical solution is easily immersed in fine-structured contact holes of the wafers, thus effectively removing contamination therefrom. In this case, the activated pure water or cleaning chemical solution generates free radicals, which further enhance the removal of contamination from the wafers.

Note that since the pure water or cleaning solution is heated for a short time by the induction heating of the microwaves, the power dissipation can be reduced as compared with the heater-heating case. In addition, since the microwaves are absorbed in the pure water or cleaning chemical solution, the wafers are hardly damaged thereby.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1:
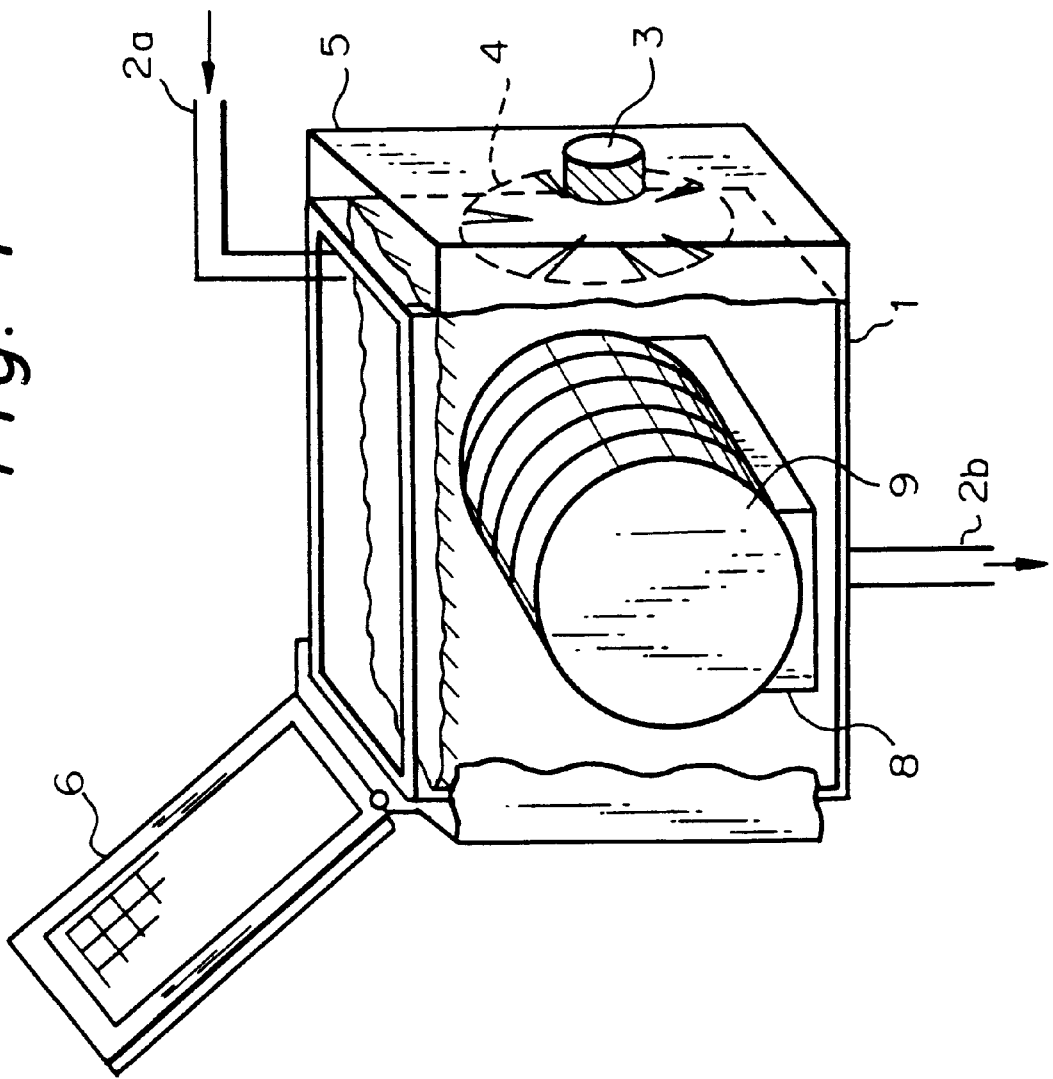
FIG. 1 is a partly-cut perspective view illustrating a first embodiment of the microwave-excitation cleaning and rinsing apparatus according to the present invention.

In FIG. 1, which illustrates a first embodiment of the present invention, reference numeral 1 designates a cell made of quartz and having an inlet 2a and an outlet 2b. Pure water or cleaning chemical solution is supplied from the inlet 2a to the cell 1. Then, when the level of pure water or cleaning chemical solution reaches a predetermined level, the pure water or cleaning chemical solution antomatically overflows from the cell 1 via the outlet 2b to a regenerating means (not shown). Thus, the pure water or cleaning chemical solution is circulated, and the level of pure water or cleaning chemical solution is maintained at the predetermined level. Also, provided in the sidewall of the cell 1 is a microwave oscillator such as a magnetron 3 for generating microwaves which are supplied to the pure water or cleaning chemical solution within the cell 1. In this case, the microwaves are homogenously dispersed in the pure water or cleaning chemical solution within the cell 1. Also, the frequency of the microwaves is from 0.4 to 25 GHz, preferably, 2.45 GHz, and the power of the microwaves is within 0.3 kW to 3 kW. In addition, in order to shield the microwaves within the cell 1, the cell 1 associated with the stirrer fan 4 is enclosed in a shield case 5 which can covered by a shield cover 6 including a metal mesh.

Further, a substrate holder 8 for mounting wafers 9 thereon is located at the bottom of the cell 1. In this case, since the level of pure water or cleaning chemical solution in the cell 1 is maintained at the predetermined level, the wafers 9 mounted on the substrate holder 8 are completely immersed in the pure water or cleaning chemical solution, so that the wafers 9 are never exposed to the air.

An example of a cleaning or rinsing operation of the apparatus of FIG. 1 is explained next.

First, before locating the substrate holder 8 mounting the wafers 9 thereon into the cell 1, the magnetron 3 is turned ON to irradiate pure water or cleaning chemical solution within the cell 1 with microwaves, so that the pure water or cleaning chemical solution is heated in advance. Then, the magnetron 3 is turned OFF.

Next, the shield cover 6 is opened, and then, the substrate holder 8 loaded with the wafers 9 is located by a carrier robot (not shown) into the cell 1. In this case, the wafers 9 are completely immersed into the pure water or cleaning chemical solution within the cell 1.

Next, the magnetron 3 is again turned ON to irradiate the pure water or cleaning chemical solution within the cell 1 with microwaves.

Finally, the magnetron 3 is turned OFF, and the substrate holder 8 loaded with the wafers 9 is removed by the carrier robot from the cell 1.

In the apparatus of FIG. 1, microwaves are irradiated in parallel with the surfaces of the wafers 9, so that the pure water within the wafers 9 can be homogenously activated. Also, another magnetron and another stirrer fan can be added on the sidewall of the cleaning cell 1 on the opposite side of the magnetron 3 and the stirrer fan 4, thus enhancing the irradiation efficiency of microwaves.

Figure 2:
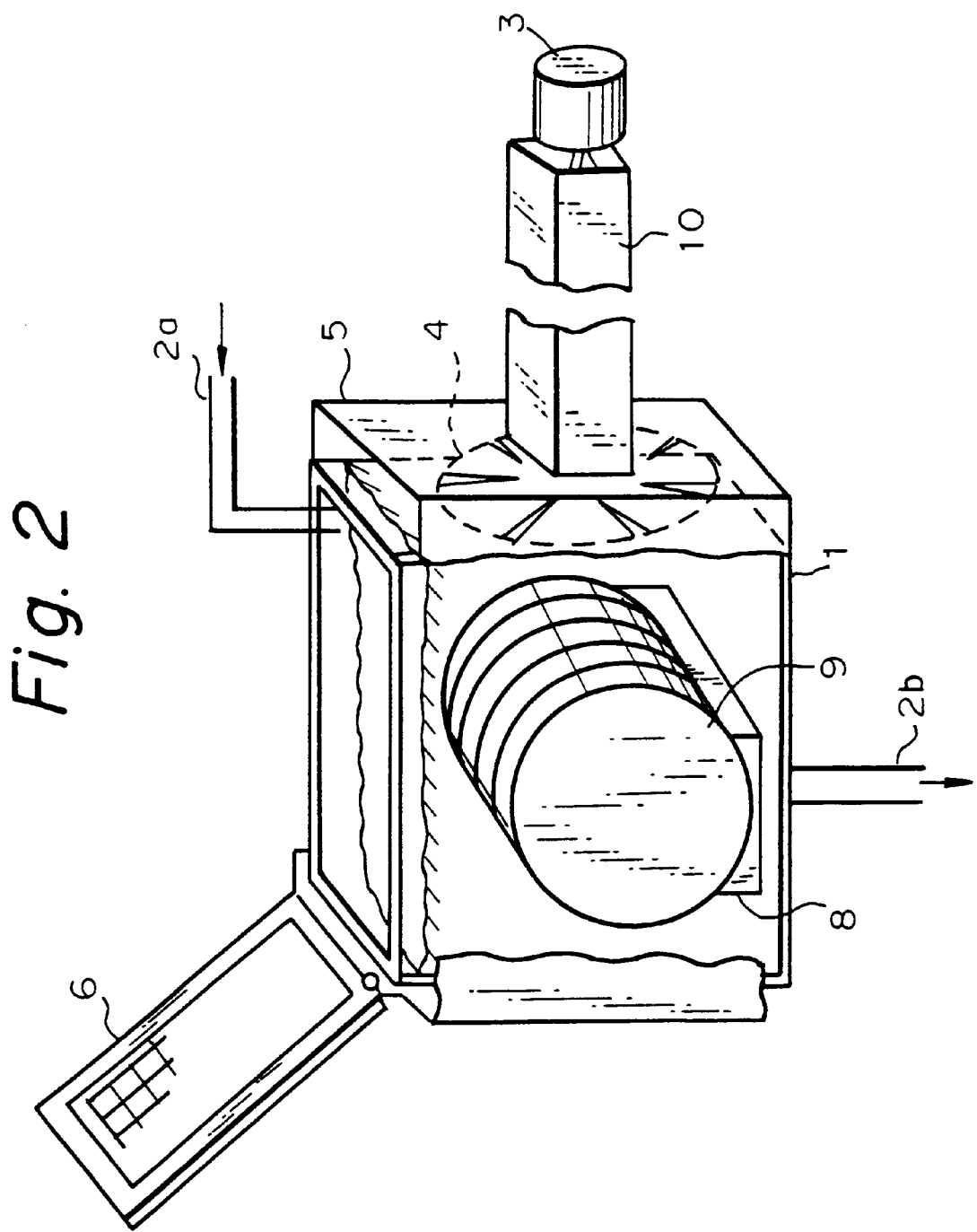
FIG. 2 is a partly-cut perspective view illustrating a second embodiment of the microwave-excitation cleaning and rinsing apparatus according to the present invention.

In FIG. 2, which illustrates a second embodiment of the present invention, a waveguide 10 is provided between the cleaning cell 1 and the magnetron 3 of FIG. 1. Generally, a plurality of microwave-excitation cleaning apparatuses are arranged in series with wet processing apparatuses and the like in a clean room. In this case, if the configuration of FIG. 2 is adopted, a plurality of microwave-excitation cleaning and rinsing apparatuses can be operated by a single magnetron.

Even in the apparatus of FIG. 2, microwaves are irradiated in parallel with the surfaces of the wafers 9, so that the pure water or cleaning chemical solution within the wafers 9 can be homogenously activated. Also, another magnetron and another stirrer fan can be added on the sidewall of the cleaning cell 1 on the opposite side of the magnetron 3 and the stirrer fan 4, thus enhancing the irradiation efficiency of microwaves.

Figure 3:
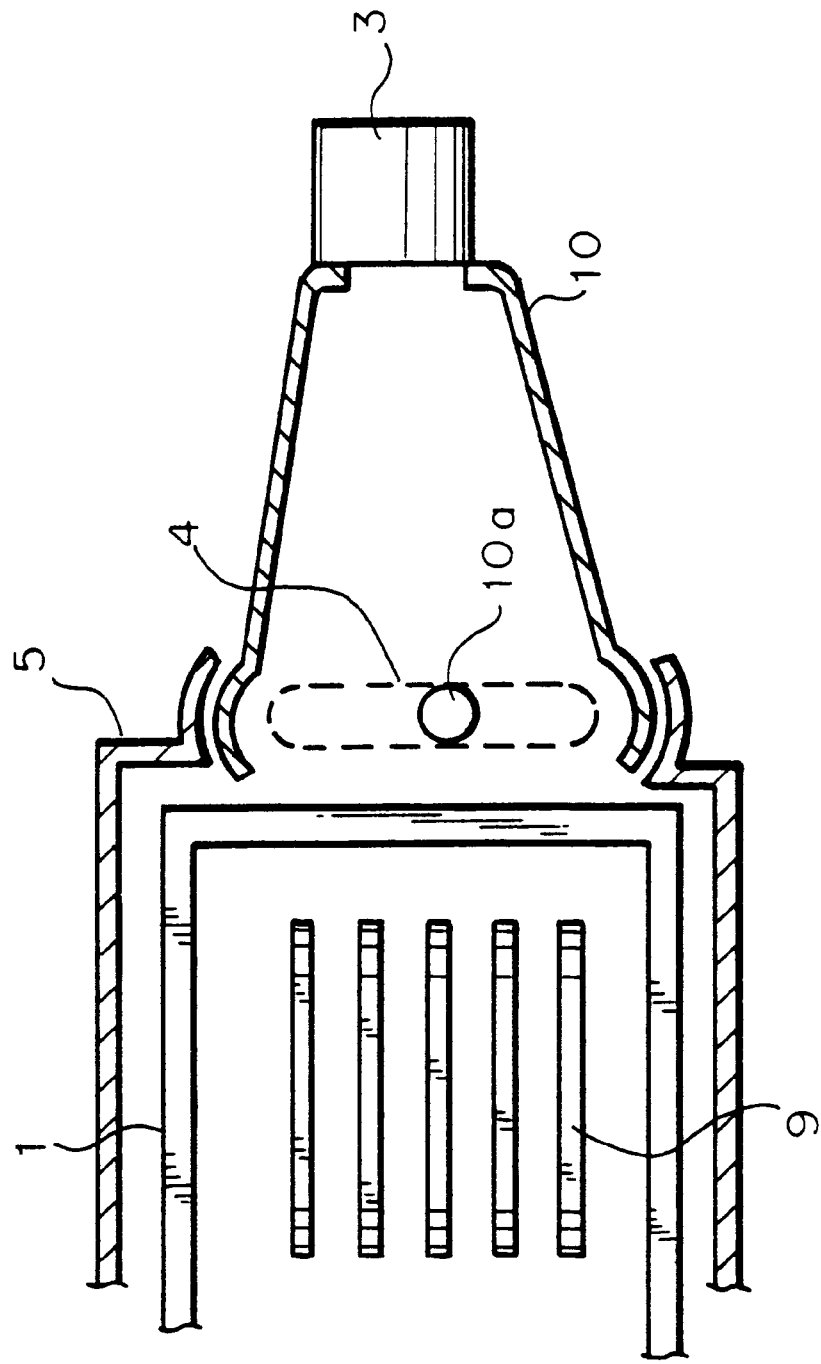
FIG. 3 is a partly-cut plan view illustrating a modification of the apparatus of FIG. 2.

In FIG. 3, which illustrates a modification of the apparatus of FIG. 2, a rotation axis 10a is provided on the lower part of the waveguide 10 of FIG. 2. Thus, the waveguide 10 can be rotated with respect to the rotation axis 10a. Therefore, the direction of the microwaves can be optimized for the wafers 9, in view of the reflection of the microwaves by the walls of the cell 1.

The effect of the cleaning operation according to present invention is explained next with reference to FIG. 4.

First, 25 wafers each having contact holes of diameters of 0.1, 0.2, 0.5, 1 and 2 $\mu$m formed in 1 $\mu$m thick silicon oxide are prepared, and the wafers are intentionally immersed in a Fe solution, so that the wafers are contaminated with Fe ions whose concentration is about $10^{13}$ atoms/cm$^2$.

Next, the wafers are immersed in an SPM solution where the ratio of hydrosulfurous acid to hydrogen peroxide water is 4 and which is heated in advance to a temperature of about 120° C. by microwaves. Then, the SPM solution is irradiated with microwaves for 5 minutes to perform a cleaning operation of the wafers. Note that the microwaves are generated by a magnetron whose power is 1 kW.

Finally, a rinsing operation using pure water is performed on the wafers by a conventional method. As a result, the contamination of the wafers, i.e., concentrations of Fe ions within the contact holes were obtained as indicated by X in FIG. 4.

On the other hand, first, 25 wafers each having contact holes of diameters of 0.1, 0.2, 0.5, 1 and 2 $\mu$m formed in 1 $\mu$m thick silicon oxide are prepared, and the wafers are intentionally immersed in a Fe solution, so that the wafers are contaminated with Fe ions whose concentration is about $10^{13}$ atoms/cm$^2$.

Next, the wafers are immersed in an SPM solution where the ratio of hydrosulfurous acid to hydrogen peroxide water is 4 and which is heated in advance to a temperature of about 120° C. by a heater. Then, the SPM solution is heated by the heater for 5 minutes to perform a cleaning operation of the wafers. Note that the heater has a power of 1 kW.

Finally, a rinsing operation using pure water is performed on the wafers by the conventional method. As a result, the contamination of the wafers, i.e., concentrations of Fe ions within the contact holes were obtained as indicated by Y in FIG. 4.

Figure 4:
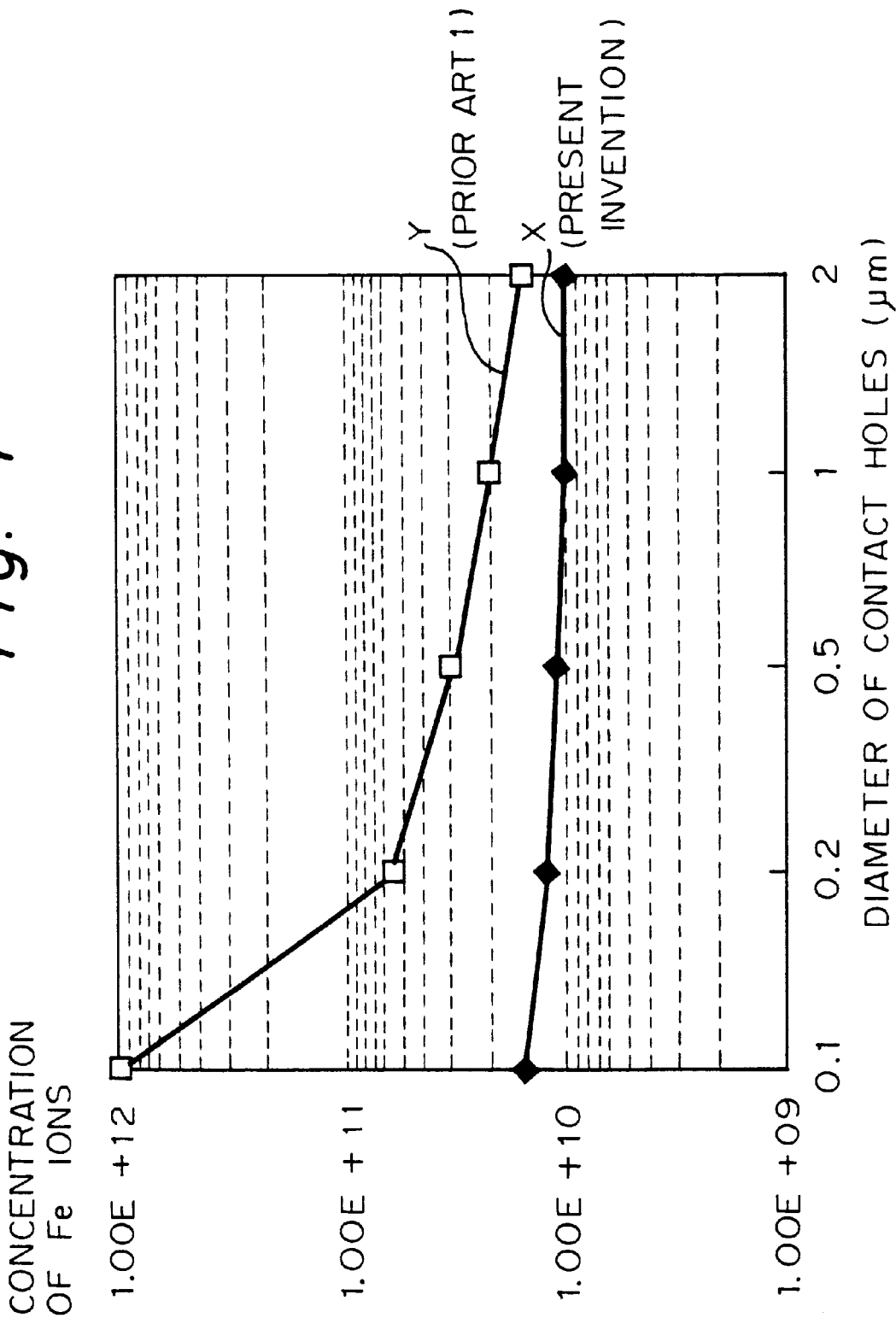
FIG. 4 is a graph showing the concentration characteristics of Fe ions in contact holes for explaining the effect of the cleaning operation according to the present invention.

As shown in FIG. 4, the contamination on the wafers is effectively removed by the present invention (X) as compared with the prior art (Y). Particularly, the smaller the diameter of contact holes, the larger the difference in the amount of contamination removed between the present invention and the prior art. This is because the viscosity of hydrosulfurous acid irradiated by microwaves is believed to be lower than the viscosity of hydrosulfurous acid heated by the heater. As a result, in the present invention, the wettability of the SPM solution on the wafers is enhanced, so that the Fe atoms of the wafers can be melted and removed.

The effect of the rinsing operation according to present invention is explained next with reference to FIG. 5.

First, 25 wafers each having contact holes of diameters of 0.1, 0.2, 0.5, 1 and 2 $\mu$m formed in 1 $\mu$m thick silicon oxide are prepared, and the wafers are intentionally immersed in a Fe solution, so that the wafers are contaminated with Fe ions whose concentration is about $10^{13}$ atoms/cm$^2$. Then, the wafers are immersed in an SPM solution where the ratio of hydrosulfurous acid to hydrogen peroxide water is 4 and which is heated in advance to a temperature of about 120° C. by microwaves. Then, the SPM solution is irradiated with microwaves for 5 minutes to perform a cleaning operation of the wafers. Note that the microwaves are generated by a magnetron whose power is 1 kW.

The cleaned wafers are immersed in pure water which is heated to a temperature of about 90° C. to 100° C. by microwaves, Then, the pure water is irradiated with microwaves for 5 minutes to perform a rinsing operation of the wafers. As a result, residual sulfate ions within the contact holes were obtained as indicated by X in FIG. 5. In this case, note that the microwaves are generated by a magnetron having a power of 1 kW.

Also, the cleaned wafers are immersed in pure water which is heated to a temperature of about 90° C. to 100° C. by a heater. Then, the pure water is heated by the heater for 5 minutes to perform a rinsing operation of the wafers. As a result, residual sulfate ions within the contact holes were obtained as indicated by Y1 in FIG. 5. In this case, note that the heater has a power of 1 kW.

Further, the cleaned wafers are immersed in pure water for 5 minutes, the pure water being subjected in advance to microwaves while the pure water is in contact with a Pb or Pt catalyst. As a result, residual sulfate ions within the contact holes were obtained as indicated Y2 in FIG. 5.

Figure 5:
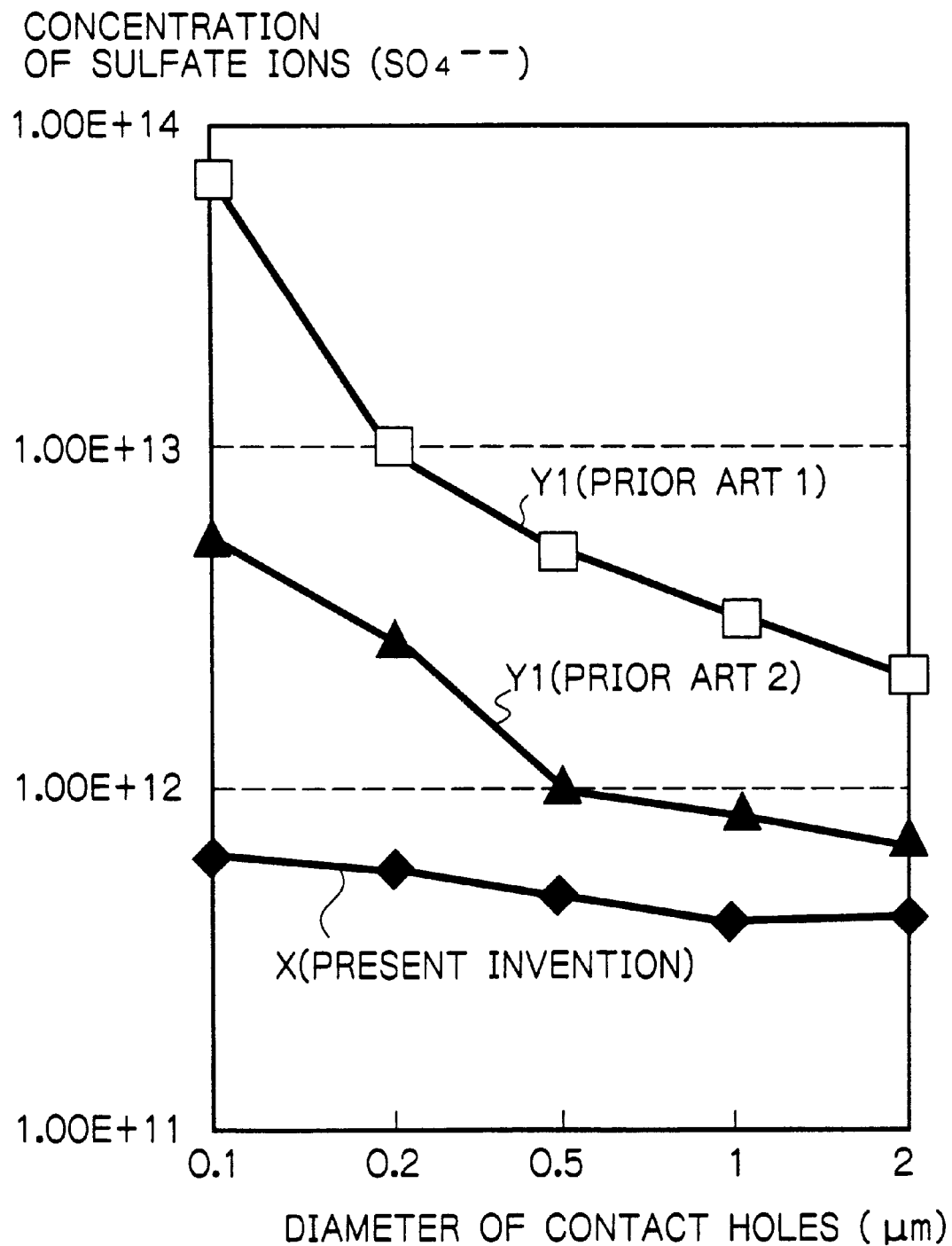
FIG. 5 is a graph showing the concentration characteristics of sulfate ions in contact holes for explaining the effect of the rinsing operation according to the present invention.

As shown in FIG. 5, residual sulfate ions on the wafers are effectively removed by the present invention (X) as compared with the prior art (Y1 and Y2). Particularly, the smaller the diameter of contact holes, the larger the difference in the amount of residual sulfate ions removed between the present invention and the prior art. This is because the viscosity of pure water irradiated by microwaves is believed to be lower than the viscosity of pure water heated by the heater. As a result, in the present invention, the wettability of the pure water on the wafers is enhanced, so that the sulfate ions on the wafers can be removed.

As explained hereinabove, according to the present invention, contamination such as organic particles, nonorganic particles and metal particles can be effectively removed.

I claim:

1. A microwave-excitation rinsing apparatus comprising:
    a cell;
    an inlet for continuously supplying pure water to said cell to a predetermined level and an outlet for exhausting water from said cell;
    a microwave oscillator for generating microwaves and irradiating the water within said cell with said microwaves;
    a wafer holder removably located in said cell for holding wafers to be cleaned with their respective flat surfaces parallel to each other; and
    wherein said microwave oscillator is arranged to generate microwaves directed parallel to the flat surfaces of said wafers within said cell.

2. The apparatus as set forth in claim 1, further comprising a waveguide arranged between said cell and said microwave oscillator.

3. The apparatus as set forth in claim 2, further comprising means for rotating said waveguide.

4. The apparatus as set forth in claim 1, further comprising a stirrer fan, provided within said cell, for homogenously dispersing said microwaves within said cell.

5. The apparatus as set forth in claim 1, wherein a frequency of the microwaves is approximately 0.4 to 25 GHz.

6. The apparatus as set forth in claim 1, wherein said water is circulated.

7. A microwave-excitation cleaning apparatus comprising;
    a cell;
    an inlet for continuously supplying cleaning chemical solution to said cell to a predetermined level and an outlet for exhausting cleaning chemical solution from said cell;
    a microwave oscillator for generating microwaves and irradiating the cleaning chemical solution within said cell with said microwaves;
    a wafer holder removably located in said cell for holding wafers to be cleaned with their respective flat surfaces parallel to each other; and
    wherein said microwave oscillator is arranged to generate microwaves directed parallel to the flat surfaces of said wafers within said cell.

8. The apparatus as set forth in claim 7, further comprising a waveguide arranged between said cell and said microwave oscillator.

9. The apparatus as set forth in claim 8, further comprising means for rotating said waveguide.

10. The apparatus as set forth in claim 7, further comprising a stirrer fan, provided within said cell, for homogenously dispersing said microwaves within said cleaning cell.

11. The apparatus as set forth in claim 7, wherein a frequency of the microwaves is approximately 0.4 to 25 GHz.

12. The apparatus as set forth in claim 8, wherein said cleaning chemical solution is circulated.

* * * * *